(12) United States Patent
Müller

(10) Patent No.: US 9,721,403 B2
(45) Date of Patent: Aug. 1, 2017

(54) SAFETY SYSTEM FOR A MOTOR VEHICLE DOOR, COMPRISING AT LEAST TWO SENSORS

(71) Applicant: Huf Hülsbeck & Fürst GmbH & Co. KG, Velbert (DE)

(72) Inventor: Ulrich Müller, Velbert (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 0 days.

(21) Appl. No.: 14/425,056

(22) PCT Filed: Aug. 16, 2013

(86) PCT No.: PCT/EP2013/067110
§ 371 (c)(1),
(2) Date: Mar. 2, 2015

(87) PCT Pub. No.: WO2014/032988
PCT Pub. Date: Mar. 6, 2014

(65) Prior Publication Data
US 2015/0325066 A1    Nov. 12, 2015

(30) Foreign Application Priority Data

Aug. 30, 2012  (DE) .............. 10 2012 108 004

(51) Int. Cl.
*G07C 9/00* (2006.01)
*E05B 81/78* (2014.01)
(Continued)

(52) U.S. Cl.
CPC ...... *G07C 9/00007* (2013.01); *B60R 25/2045* (2013.01); *E05B 81/04* (2013.01);
(Continued)

(58) Field of Classification Search
CPC ............ G07C 9/00007; G07C 2209/64; G07C 9/00309; B60R 25/2045; E05B 81/04; E05B 81/64; E05B 81/77; E05B 81/78; H03K 17/955; H03K 2017/9604

USPC ................................................ 340/5.61, 5.72
See application file for complete search history.

(56) References Cited

U.S. PATENT DOCUMENTS 5,596,317 A * 1/1997 Brinkmeyer ............ B60R 25/24
180/287
6,100,811 A * 8/2000 Hsu ..................... B60H 1/00642
340/426.36

(Continued)

FOREIGN PATENT DOCUMENTS

DE    102008014516    10/2008
DE    102010037509     3/2012

(Continued)

OTHER PUBLICATIONS

International Search Report and the Written Opinion Dated Nov. 11, 2013 From the International Searching Authority Re. Application No. PCT/EP2013/067110 and Its Translation Into English.

*Primary Examiner* — Yong Hang Jiang

(57) ABSTRACT

The invention relates to a safety system for a door in a motor vehicle, comprising an electronic unit that includes at least one first and a second sensor. Each sensor has its own monitoring zone on the motor vehicle door. The safety system further comprises a lock which is arranged on the motor vehicle door and can be switched between a locked position and an unlocked position, as well as a user-held identifier which can be brought into data communication with a transceiver unit in the motor vehicle for authentication purposes. The electronic unit is designed in such a way as to be able to generate a trigger signal by having the user execute at least one defined movement pattern within the monitoring zones, thus allowing the position of the lock to be switched.

16 Claims, 6 Drawing Sheets

Figure 1:
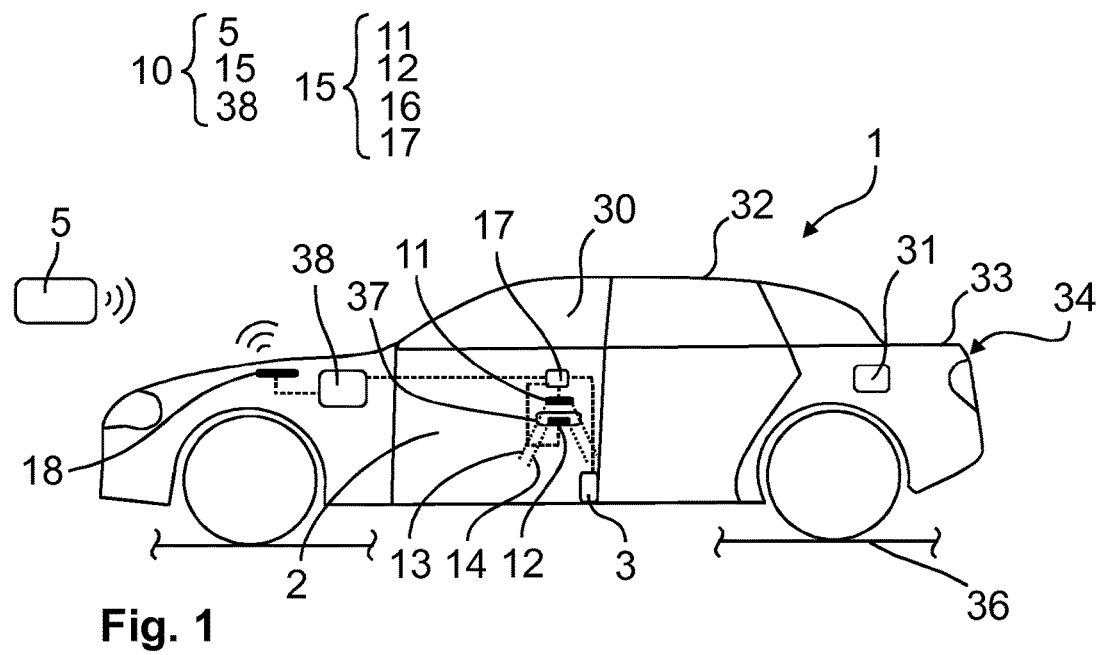

(51) Int. Cl.
  *E05B 81/04* (2014.01)
  *E05B 81/64* (2014.01)
  *B60R 25/20* (2013.01)
  *H03K 17/955* (2006.01)
  *H03K 17/96* (2006.01)

(52) U.S. Cl.
  CPC .............. *E05B 81/64* (2013.01); *E05B 81/77* (2013.01); *E05B 81/78* (2013.01); *G07C 9/00309* (2013.01); *E05Y 2400/852* (2013.01); *E05Y 2400/86* (2013.01); *G07C 2209/64* (2013.01); *H03K 17/955* (2013.01); *H03K 2017/9604* (2013.01)

(56) References Cited

U.S. PATENT DOCUMENTS

| | | | |
|---|---|---|---|
| 7,071,812 B2 * | 7/2006 | Mafune | B60R 25/246 340/426.28 |
| 2003/0216817 A1 * | 11/2003 | Pudney | E05B 81/78 700/17 |
| 2007/0205863 A1 * | 9/2007 | Eberhard | B60R 25/2036 340/5.72 |
| 2010/0185341 A1 | 7/2010 | Wilson et al. | |
| 2010/0328257 A1 * | 12/2010 | Noguchi | G06F 3/044 345/174 |
| 2011/0118946 A1 * | 5/2011 | Reimann | B60R 25/2036 701/49 |
| 2011/0181387 A1 * | 7/2011 | Popelard | B60R 25/246 340/5.2 |
| 2012/0265716 A1 * | 10/2012 | Hunzinger | G06N 99/005 706/12 |

FOREIGN PATENT DOCUMENTS

| DE | 102010060364 | 5/2012 |
|---|---|---|
| EP | 1970265 | 9/2008 |
| WO | WO 2011/092341 | 8/2011 |
| WO | WO 2014/032988 | 3/2014 |

\* cited by examiner

SAFETY SYSTEM FOR A MOTOR VEHICLE DOOR, COMPRISING AT LEAST TWO SENSORS

RELATED APPLICATIONS

This application is a National Phase of PCT Patent Application No. PCT/EP2013/067110 having International filing date of Aug. 16, 2013, which claims the benefit of priority of German Patent Application No. 10 2012 108 004.6 filed on Aug. 30, 2012. The contents of the above applications are all incorporated by reference as if fully set forth herein in their entirety.

FIELD AND BACKGROUND OF THE INVENTION

The invention relates to a safety system for a door of a motor vehicle with an electronic unit, a lock assembled at the motor vehicle door that can be adjusted in a locking position and in an unlocking position, and a user-held identifier, which can be involved in data communication with the vehicle-related transceiver unit for authentication purposes.

In document DE 42 187 98 A1 a key-related locking system for locks at vehicle doors is disclosed. The mentioned state-of-the-art is not sufficient anymore for the present comfort requirements.

SUMMARY OF THE INVENTION

The object of the present invention is to avoid the previously mentioned disadvantages, particularly to further develop a safety system in a way that the user can comfortably operate the safety system wherein at the same time the actuation requirement is reduced and a compact assembly at the vehicle is established.

The object of the present invention is solved by all features of claim 1. In the dependent claims advantageous embodiments are mentioned.

According to the invention a safety system for a door of a motor vehicle is intended, with an electronic unit, which comprises at least a first and a second sensor, wherein each sensor comprises a particular monitoring zone at the motor vehicle door, a lock assembly at the motor vehicle door that can be brought into a locking position and an unlocking position, and a mutual user-held identifier, which can be involved in data communication for authentication purpose with the vehicle-related transceiver unit, wherein the electronic unit is performed in a way that via at least one defined movement pattern of the user within the monitoring zone a trigger signal can be generated by the electronic unit, wherein a change of position of the lock is possible.

A main advantage of this invention is that two sensors are integrated within the electronic unit, which each comprise a particular monitoring zone, in order to reliably detect a movement pattern of the user. By the application of two sensors the operation reliability for detecting a defined movement pattern is mainly increased. Hereby the movement pattern can be a defined movement gesture of the user, which is to be recognized by the electronic unit in order to release a defined vehicle-related action, particularly an operating function, which can at least release the lock of the motor vehicle and also further operating functions. The movement pattern can involve for example a simple back and/or forth movement of a body part of the user in the proximity of the first and/or second sensor. The movements to be recognized by the electronic unit can also be more complex whereupon is further described below. It is also covered that the vehicle-related transceiver unit is at the same time the first and/or the second sensor. The invention also provides that the user touches the motor vehicle at least partially within the scope of the movement pattern. It is further possible that the movement pattern occurs completely contact free towards the motor vehicle in a defined particularly in a close distance to the motor vehicle door. The electronic unit is performed in a way that the movement pattern can be conducted which only occurs along the first and/or the second sensor without mainly altering the distance to said sensors. Further, the electronic unit can recognize an approaching to the motor vehicle via said sensors, wherein the movement pattern that can also be more complex.

And in an action improving the invention it can be intended that a handle is assembled at the motor vehicle door, in which the electronic unit is at least partially integrated wherein particularly the first sensor is assembled in the motor vehicle door and second sensor is assembled in the handle.

The handle can comprise a door handle, which for example extends protrusion-like to the outside at the motor vehicle door. This door handle can be stationary assembled at the motor vehicle door, which means that the door handle is rigidly attached at the motor vehicle door. Alternatively, it is possible that the door handle can be moved relative to the motor vehicle door by the user during the usage in order to for example bring the lock from the locking position into the unlocking position or in an opening position in order to open the motor vehicle door. The first sensor can for example be assembled within the door handle. In other embodiments, the handle can comprise further components—beneath the door handle—which are for example integrated within the motor vehicle door. The first sensor and/or the second sensor can also be assembled in these components.

Surprisingly it has been shown that good functionality is registered during the recognition of the movement pattern, if the first sensor comprises a distance to the second sensor, which is between 5 cm≤D≤30 cm, particularly between 10 cm≤D≤20 cm.

In a possible embodiment of the safety system according to the invention the motor vehicle door can comprise a recessed grip, at which particularly the handle is assembled wherein the first sensor and/or the second sensor is assembled at the recessed grip.

Alternatively the invention comprises that the motor vehicle door is shaped without handle particularly without grip so that the first and second sensor is positioned in the motor vehicle door.

With the last-mentioned embodiment, the motor vehicle door can for example comprise a kind of a recessed grip or elevation so that the user can engage the motor vehicle door with the hand, in order to comfortably open and/or close the door. Advantageously the first and the second sensor are assembled in the proximity of the recessed grip or said elevation so that it is clear and obvious for the user where the movement pattern has to occur.

Further, it is possible that the first sensor is assembled adjacent to the second sensor and/or that the first sensor is assembled horizontally to the platform of the motor vehicle adjacent to the second sensor and/or that the first sensor is assembled horizontally to the platform of the motor vehicle above the second sensor and/or that the first sensor is at least partially assembled above the second sensor. Moreover, the invention can comprise that the first sensor is positioned behind or in front of the second sensor, which can for example be the case when one of both sensors is assembled in the handle, particularly the door handle and the further, second sensor is assembled related to the vehicle.

The monitoring zone of the first sensor can at least partially overlap with the monitoring zone of the second sensor. At the same time, it is possible that the monitoring zones are of diverse sizes in order to detect the movement pattern of the user. Likewise, the invention comprises that the monitoring zones are mainly equal in size in order to detect the movement pattern of the user.

According to the invention the safety system can be perform in a way that by a positive sensing of the movement pattern of the user by the electronic unit an authentication purpose is initiated. The data communication occurs here between the user-held identifier and the vehicle related transceiver unit. If a positive authentication is available the electronic unit generates a trigger signal wherein a change of the position of the lock is possible. If no positive authentication is available, the lock remains in its position. Furthermore, it can be intended that the electronic unit already initiates an authentication purpose previous to the recognition of the movement pattern. This can be realized for example by the fact that the authentication purpose is already conducted starting from a defined distance to the motor vehicle. If positive authentication is available, the user can initiate the vehicle-related action via a defined movement pattern. For example, it is possible that starting with a positive authentication both sensors are switched on in order to effectively sense the movement pattern. Otherwise, both sensors remain ineffective, which means that these sensors are switched off. The decision at what time the sensors are to be switched ineffective can occur via the electronic unit or via a separate, vehicle-related control, which is integrated in the safety system according to the invention.

Further, a defined time interval can be intended in the electronic unit, in which both sensors are to be activated according to the movement pattern in order to generate a trigger signal.

Hereby it can be intended that the sensors can be activated commonly or consecutively or at the same time for the recognition of the movement pattern. Further, it is possible that both sensors are to be applied in alternation to the representation of one or multiple operating functions. Naturally, also both sensors can require an application commonly and at the same time, which in turn leads to another operating function.

Further, the security system can according to the invention comprise an electronic unit with three sensors wherein the first and the second sensor serve for the recognition of the movement pattern at the motor vehicle door and the third sensor is assembled at the motor vehicle in a way in order to already recognize the user without the performance of the movement pattern of the user at the motor vehicle. For example the third sensor can be activated outside the motor vehicle by the user, wherein particularly the third sensor can be activated via another movement pattern. For example the safety system according to the invention can intend that the third sensor is assembled underneath the motor vehicle door particularly at the door sill or that the third sensor is assembled at or under the bumper at the motor vehicle rear end.

The movement pattern assembled for the third sensor can for example correlate with the movement pattern, which is assembled to the first and to the second sensor. Alternatively, the movement pattern differs for the third sensor. It is possible that the third movement pattern can be realized via a foot movement of the user wherein the third sensor can be arranged underneath the motor vehicle door. The third movement pattern can occur consciously or unconsciously via the user particularly only by the fact that the user positions itself beneath the motor vehicle door. Via said movement pattern a first operating function and/or the vehicle-related action can be initiated, particularly the authentication purpose can be initiated.

Moreover, the electronic unit can comprise an evaluation unit, which can generate in dependence with the movement pattern that has been sensed by the first and the second sensor and/or the third sensor the following trigger signals for vehicle-related actions:

locking of the lock and/or unlocking of the lock and/or opening of the motor vehicle door and/or closing of the motor vehicle door and/or opening of the motor vehicle window and/or closing of the motor vehicle window and/or opening of the fuel lid of the motor vehicle and/or closing of the fuel lid of the motor vehicle and/or closing of the sliding roof of the motor vehicle and/or opening of the sliding roof of the motor vehicle and/or closing of the trunk lid of the motor vehicle and/or opening of the trunk lid of the motor vehicle. The evaluation unit can be integrated in the electronic unit. Likewise, it is possible that the evaluation unit is assembled within the control of the motor vehicle. Moreover, at least one sensor can be switched ineffective by the evaluation unit particularly with or without time delay.

The safety system according to the invention can comprise a lock, which is a mechanic lock. With this embodiment the door handle can be in connection with the lock via a coupling element. This coupling element can for example be a Bowden cable so that with a movement of the door handle at the same time the Bowden cable can correspondingly move the lock from its locking position to its unlocking position wherein the motor vehicle door can be opened by the user. With this embodiment an effective coupling between the door handle and the lock only occurs when a positive authentication and/or positive recognition of the movement pattern has occurred. Otherwise the door handle is uncoupled with the lock so that via the activation of the door handle no change of positions of the lock is possible. Alternatively the lock can be an electromechanical lock, which can be controlled electronically via the electronic unit and/or the vehicle-related control and/or the evaluation unit of the electronic unit. This means that via signal particularly the trigger signal according to the invention the electromechanical lock can take or change its particular position. In the last mentioned embodiment of the invention it can be intended that the motor vehicle door comprises a handle particularly door handle. Likewise, it is possible that the motor vehicle door is performed without door handle.

In another provision improving the invention the safety system comprises an electronic unit, wherein new and/or additional movement patterns can be generated by the user and can be detected by both sensors in order to create trigger signals for further vehicle-related actions.

This means that the user can individually integrate further movement patterns in the safety system, which can be learned by the electronic unit. It is possible that the vehicle-related control or the electronic unit according to the invention provides a pool of possible vehicle-related actions for the user, which are individually selectable by the user wherein at the same time the user can correlate its personal movement pattern to the vehicle-related action, which in turn are to be detected from said sensor.

BRIEF DESCRIPTION OF THE SEVERAL VIEWS OF THE DRAWING(S)

Further advantages, features and details of the invention result from the dependent claims and the subsequent description, in which in reference to the drawings multiple embodiments of the invention are described in detail.

Figure 2:
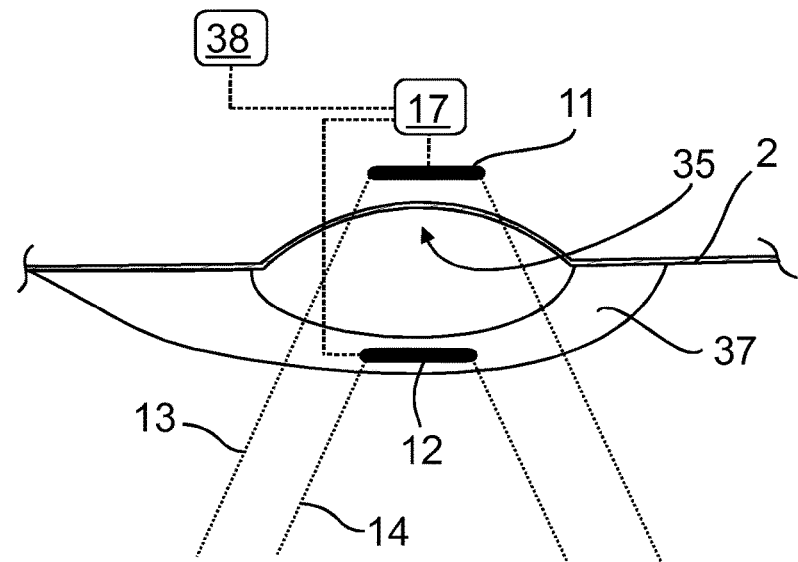
Figure 3:
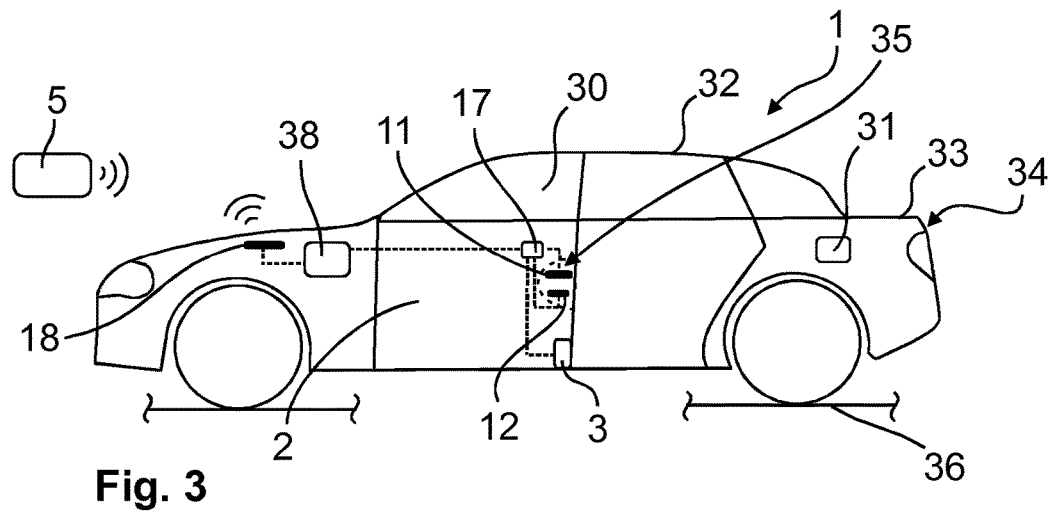
Figure 4:
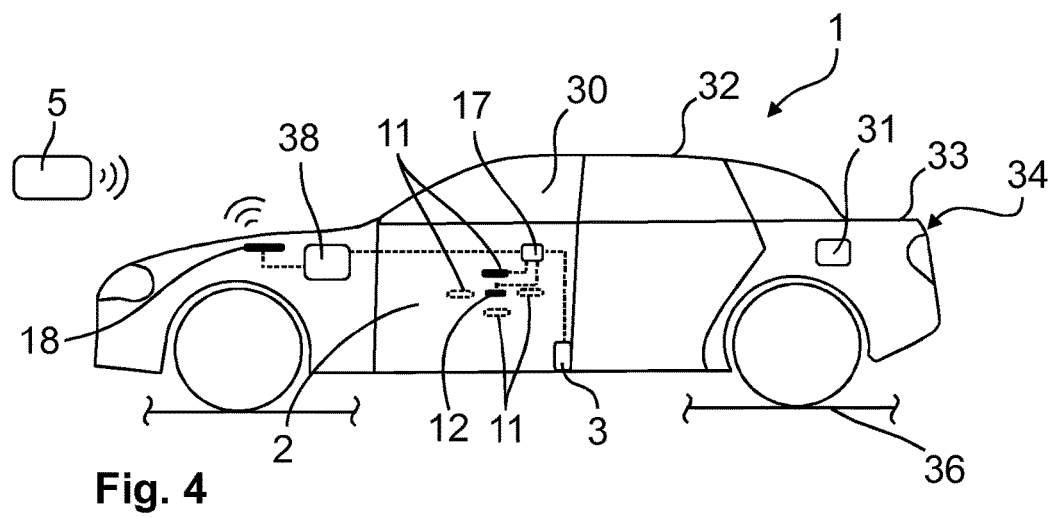
Figure 5:
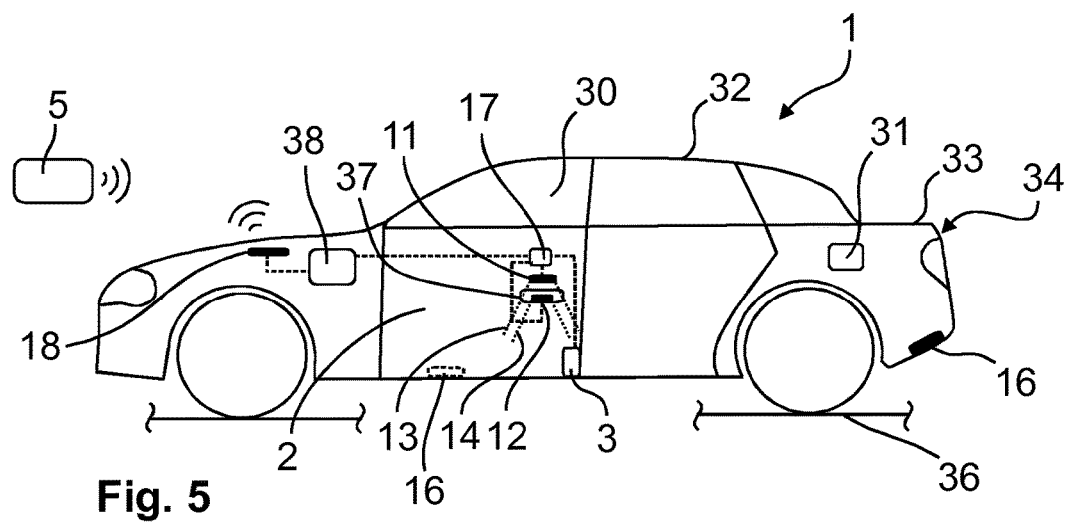
Figure 6:
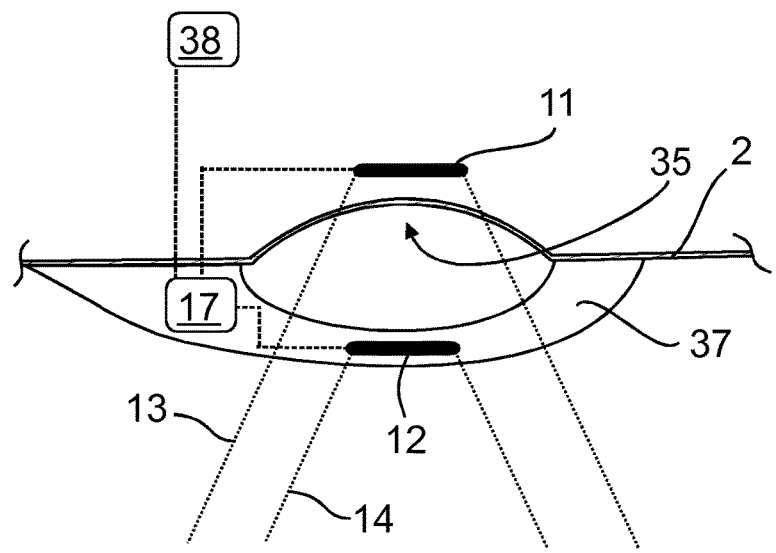
Figure 7:
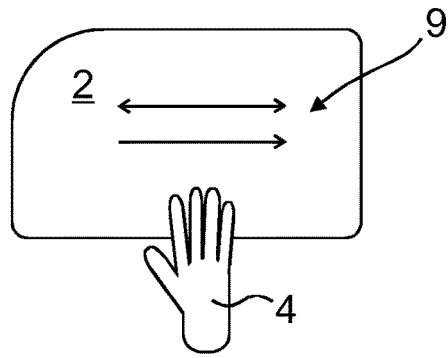
Figure 8:
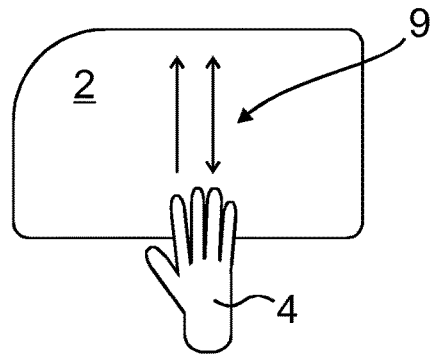
Figure 9:
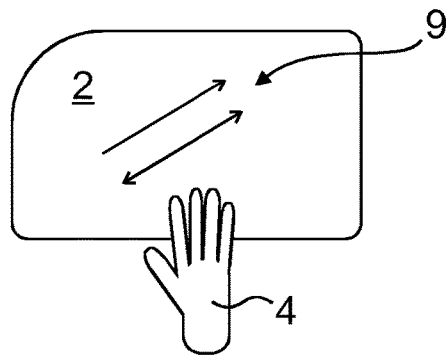
Figure 10:
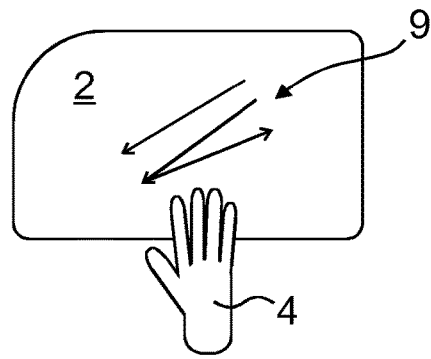
Figure 11:
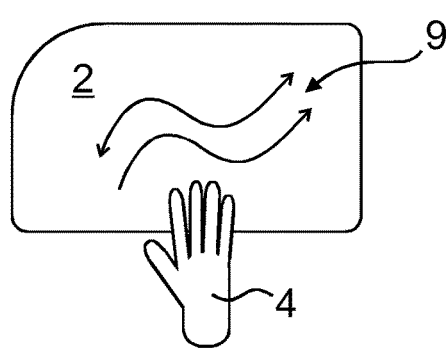
Figure 12:
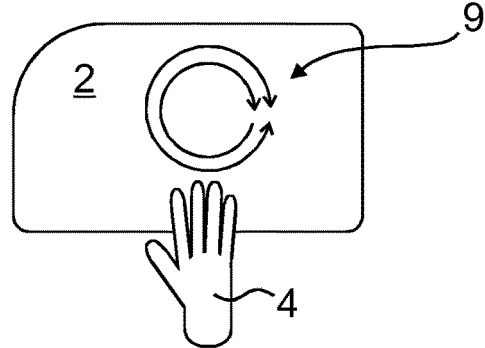
Figure 13:
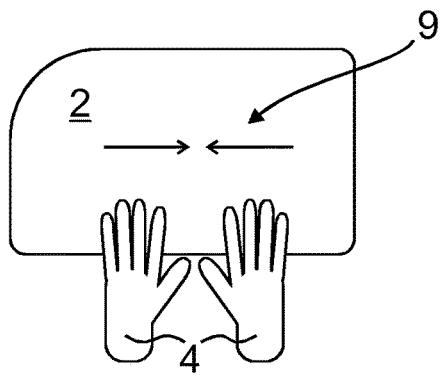
Figure 14:
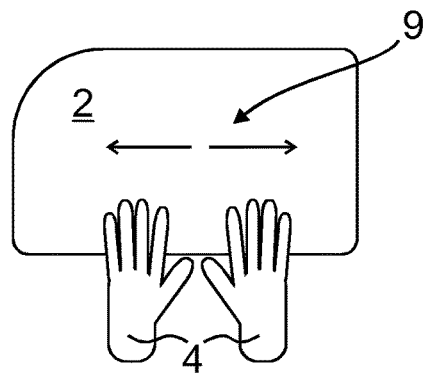
Figure 15:
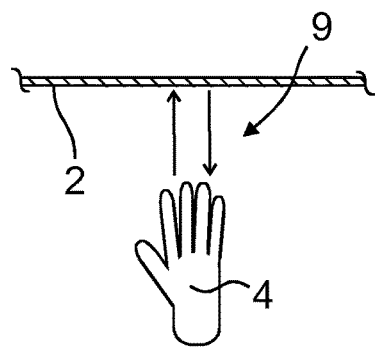
Figure 16:
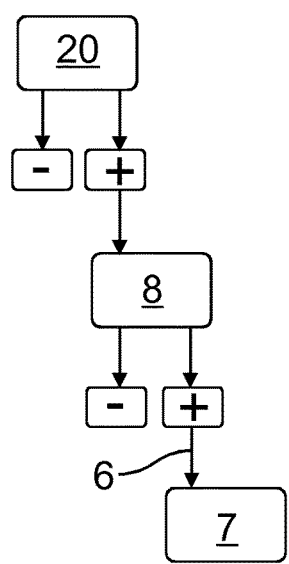
Figure 17:
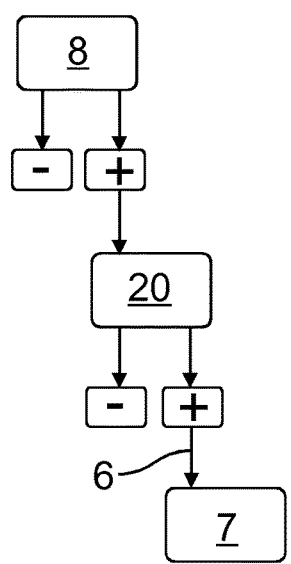
Figure 18:
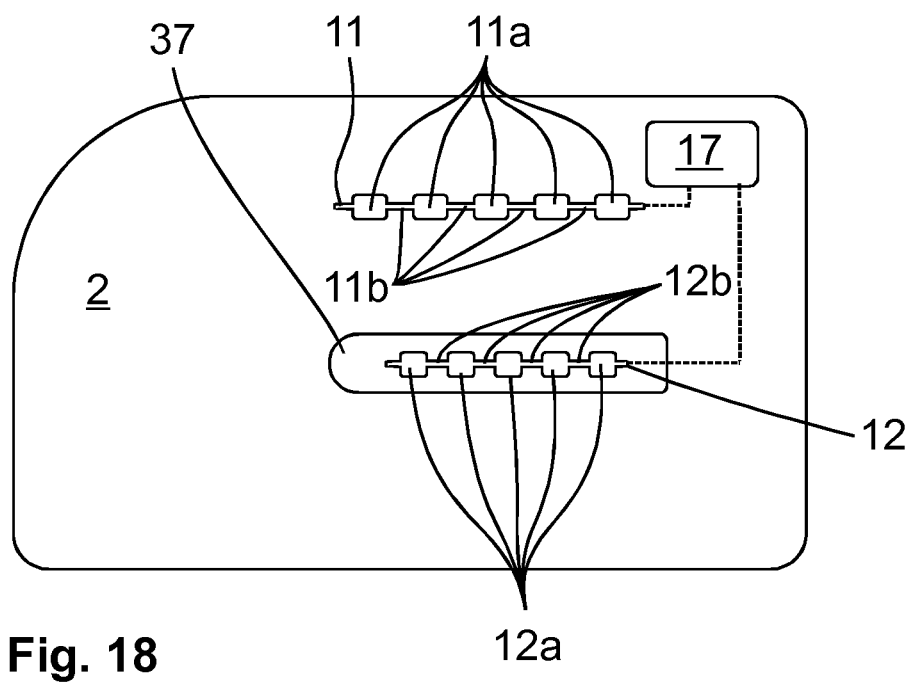

Thereby features mentioned in the claims and in the description can each individually or in any combination be essential for the invention. It is shown:

FIG. 1 a schematic drawing of a motor vehicle, which is equipped with a safety system in order to recognize a defined movement pattern of the user, FIG. 2 a schematic drawing of a portion of a vehicle door at which a door handle is assembled, FIG. 3 a schematic drawing of a portion of a vehicle door, which is performed without door handle, FIG. 4 another embodiment of the safety system according to the invention, which is integrated in the motor vehicle, FIG. 5 another embodiment of the safety system according to the invention, which is intended in a motor vehicle, FIG. 6 another embodiment of the safety system of a motor vehicle according to the invention, FIG. 7 a possible movement pattern, which is recognized by the safety system according to the invention, FIG. 8 another movement pattern, which is recognized by the safety system, FIG. 9 another alternative of a movement pattern, which is recognized by the safety system according to the invention, FIG. 10 another alternative of a movement pattern which is recognized by the safety system, FIG. 11 another embodiment of a movement pattern, which is recognized by the safety system, FIG. 12 another embodiment of a possible movement pattern, which is recognized by the safety system, FIG. 13 another embodiment of the movement pattern, which is recognized by the safety system, FIG. 14 another embodiment of a possible movement pattern, which is recognized by the safety system, FIG. 15 another embodiment of a possible movement pattern, which is recognized by the safety system, FIG. 16 a schematic drawing, which in a simplified manner visualizes at least partially the operation of the safety system according to the invention, FIG. 17 another alternative according to FIG. 16 and FIG. 18 a possible embodiment of the sensor for recognition and/or detection of a movement pattern of the user.

DESCRIPTION OF SPECIFIC EMBODIMENTS OF THE INVENTION

FIG. 1 shows a motor vehicle 1 with a door 2, which can be locked and/or unlocked by a lock 3. The motor vehicle 1 comprises a safety system 10, which is assembled on the one hand by an electronic unit 15, which comprises at least a first sensor 11 and a second sensor 12. Each sensor 11, 12 comprises an own monitoring zone 13, 14, in order to recognize a defined movement pattern 9 of the user 4. On the other hand, the safety system 10 comprises a user-held identifier 5, which can be brought in data communication with the electronic unit 15 for an authentication purpose. In the following embodiments, the motor vehicle 1 comprises a transceiver unit 18 serving for data communication between the motor vehicle 1 and the user-held identifier 5. Likewise, the user-held identifier 5 comprises a not explicitly shown transceiver unit in order to guarantee a data communication between the electronic unit 15 and the user-held identifier 5 for the authentication purpose.

The embodiment according to FIG. 1 comprises a handle 37, which particularly serves as a door grip for the user 4. In FIG. 2 it is schematically shown that the first sensor 11 can be assembled in the motor vehicle door 2 wherein the second sensor 12 is integrated in the door handle 37. Both sensors 11, 12 are electronically connected to an evaluation unit 17. It is possible that the evaluation unit 17 is part of a vehicle-related control electronic 38. Likewise, it is possible that the vehicle related control 38 is available, which is electronically connected to the electronic unit 15 particularly with the evaluation unit 17. The evaluation unit 17 can, according to FIG. 6, also be integrated within the door handle 37.

In FIG. 3 mainly the safety system 10 according to FIG. 1 or FIG. 2 is shown, however the motor vehicle door 2 comprises no door handle, so that the door is performed without handle. The door 2 can for example comprise the recessed grip 35, which is also shown in FIG. 2. Alternatively it is possible that according to FIG. 3 an elevation 35 is available at which the user can affect with the hands in order to open and/or close the door 2. In the area of the recess grip 35 the electronic unit 15 according to the invention is assembled with the first sensor 11 and the second sensor 12 wherein each of both sensors 11, 12 comprises its own monitoring zone 13, 14.

In FIG. 4 it is schematically shown that both sensors 11, 12 can be diverse assembled to one another at the door 2. Herewith, it is shown in this embodiment to what extend the door 2 is performed with a door handle according to FIG. 1 or 2 or without a door handle according to FIG. 3. For example it is possible that the first sensor 11 is assembled horizontal to the platform 36 of the motor vehicle 2 adjacent to the second sensor 12. This means that the first sensor 11 can be positioned on the left or on the right from the second sensor 12. Likewise, FIG. 4 shows that the first sensor 11 can be positioned above or underneath the second sensor 12 at the motor vehicle door 2.

In FIG. 5 mainly the safety system 10 according to FIGS. 1 to 4 is shown wherein another sensor 16 is shown, which is assembled underneath the motor vehicle door 2. Likewise, it can be intended that the first sensor 16 is attached at the motor vehicle rear end 34 at or underneath the bumper.

According to all embodiments the electronic unit 15 particularly the first and the second sensor 11, 12 are able to detect at least one defined movement pattern 9 of the user 4 wherein a change of positions of the lock 3 is possible particularly that the lock 3 can be positioned from the locking position to the unlocking position and/or vice versa. At this point it should be mentioned that the lock 3 is a mechanical lock or an electromechanical lock. Thereby it is to be understood that the mechanical lock 3 can be mechanically driven by the handle 37 in order to achieve a change of the lock position. With an electromechanical lock 3 a transmission of a signal occurs via the safety system 10 whereby the electromechanical lock 3 is actuated via the signal in order to move in the particular position.

According to all embodiments, the electronic unit 15 can recognize different movement patterns 9 and can correspondingly generate different trigger signals for vehicle-related actions. This means that by a defined movement pattern of the user at least the lock 3 can be activated in order to move in the particular position. Further, the safety system 10 is constructed in a way that further vehicle-related actions are possible, which can be triggered by a further movement pattern of the user. According to FIG. 7 to FIG. 15 possible movement patterns 9 are schematically shown, which can trigger different vehicle-related actions wherein these movement patterns 9 can be sensed via the first 11 and the second sensor 12. The evaluation unit 17 according to FIG. 1, 2, 5 or FIG. 6 can evaluate and process the detected signals in order to decide finally, which vehicle-related action is triggered by the safety system 10. A movement pattern 9 can for example be that the hand of the user 4 moves horizontally to the left and/or to the right. According to FIG. 8 a movement pattern 9 is shown, which by the movement of the hand of the user 4 defines vertically to the top and/or to the bottom. A further movement pattern 9 is characterized by a movement directed from left down to right up wherein arrived right up the movement can continue back to the starting point (see FIG. 9). FIG. 10 on the other hand shows a movement from right up in the direction of left down wherein the movement can return from left down to right up. In FIG. 11 a meander-like distribution of the movement pattern 9 is shown. In FIG. 12 it is possible that a movement pattern 9 can be deposited for the safety system 10, which can be realized via a mainly circular movement or anticlockwise to the user hand 4.

According to FIG. 13 and FIG. 14 both hands of the user 4 are necessary in order to realize a movement pattern 9. The movement pattern 9 according to FIG. 13 is realized by the fact that both hands are moved towards one another. In FIG. 14 the movement pattern 9 is realized by the fact that both hands are move away from one another. All movement patterns 9 according to FIG. 7 to FIG. 14 occur in the monitoring zone 13, 14, which comprise the sensors 11, 12 according to FIGS. 1 to 6. The movement patterns 9 are naturally also available for the third sensor 16 according to FIG. 5. The shown movement patterns 9 also include that an approaching or a movement away according to FIG. 15 of a user 4 from the motor vehicle door 2, particularly from the electronic unit 15 according to the invention wherein the movement pattern 9 is defined.

Possible vehicle related actions, which can be triggered by the shown movement patterns 9 can for example be that a support of the opening procedure of the motor vehicle door 2 occurs or the support of the closing procedure of the motor vehicle door 2 can be triggered. Likewise, it is possible that by a defined movement pattern 9 the fuel lid 31 and/or the sliding roof 32 and/or the trunk lid 33 and/or the window 30 can be opened or closed.

The third sensor according to FIG. 5 can initially serve for positively recognizing the user 4 previous to the ignition of the detection of the movement pattern 9 via both sensors 11, 12. It is possible that a defined time interval is intended in the electronic unit 15 with which both sensors 11, 12 are deactivated. For example the activation can occur in a way that after a positive authentication purpose between the user-held identifier 5 and the safety system 10 both sensors 11, 12 are switched on in order to detect possible movement patterns 9 of the user 4. Likewise, it is possible that the third sensor 16 triggers the switching on of both sensors 11, 12.

Advantageously it is possible that all embodiments comprise a safety system 10 with which individual new movement patterns 9 can be generated by the user 4 in order to generate individual trigger signals for vehicle-related actions.

In FIG. 16 it is shown that the safety system 10 initially registers a movement pattern via both sensors 11, 12, which is schematically shown in reference 20. If the movement pattern corresponds to the deposited movement pattern in the electronic unit 15 an authentication purpose 8 occurs in order to determine in how far the user is authorized to perform one or multiple vehicle-related actions 7. The authentication purpose 8 occurs between the safety system 10 and the user-held identifier 5, which is among others shown in FIG. 1. If a positive authentication is available a corresponding trigger signal 6 occurs via the electronic unit 15 wherein the vehicle related action 7 is initiated, which can for example be a change of the positions of the lock 3.

In FIG. 17 a further alternative is shown, which describes the functionality of the safety system 10. If the user 4 is near the motor vehicle 1 an authentication purpose 8 initially occurs, which is for example consciously or unconsciously triggered by the user. Likewise, the authentication purpose 8 occurs in a way that the data communication between the user-held identifier 5 and the vehicle-related electronic unit 15 occurs. If a positive identification is available at least the sensors 11, 12 are switched active in order to sense one or multiple movement patterns 9, which are schematically shown with reference 20. If a positive recognition of the movement pattern 9 is available a generation of a trigger signal 6 occurs whereby a vehicle related action 7 is triggered.

The safety system 10 according to all embodiments can be performed in a way that multiple users 4 can have different movement patterns 9 in order to trigger signals for vehicle-related actions. Likewise, it is possible that for defined vehicle related actions no authentication purpose is necessary.

In FIG. 18 a possible embodiment of the sensors 11, 12, 16 is shown, which is shaped as an elongated flat electrode wherein in longitudinal direction sensitive electronic unit sections 11a, 12a with a first surface width with minor sensitive electrode sections 11b, 12b and a second smaller surface width are alternating. Independent from this embodiments according to FIG. 18 said sensors 11, 12, 16 are advantageously capacitive sensors, which reliably recognize an approaching or touching via a capacity change. The basic is that the capacity of the conductor depends upon the disc distance. Normally the capacity is increased the closer the user approaches to the particular sensor 11, 12, 16.

The flat electrode 11, 12 according to FIG. 18 is shaped from an electric conducting material or a combination of electric conducting materials. The electrode surface is along the longitudinal direction subdivided in different sections, which means in broader sections 11a, 12a and in smaller sections 11b, 12b. The sections with smaller surface width are easier to deform as the areas with a greater surface width. Hereby it is essential that specific areas with a higher deformation are shaped in the flat electrode 11, 12, which increase the flexibility of the flat electrode 11, 12 and permit an adaptation of the distribution of the flat electrode 11, 12 at the vehicle contour. Advantageously the flat electrode 11, 12 can comprise an isolated coating, which is not explicitly shown. By this layout, on the one hand a pretty flat and space-saving flat electrode 11, 12 is shaped. Moreover, the flat electrode 11, 12 appears with its shape of a continuous conductor similar to the interconnection of conductive plates of different sizes since the electrode sections 11a, 12a, 11b, 12b are electrically connected a potential liquidation occurs at the flat electrode 11, 12. Correspondingly, the areas 11a, 12a react stronger as the narrowed areas 11b, 12b to approaching and touching. A body part of the user 4, which is moved along the shown electrode 11, 12 generates different signals according to the position, which for example emerge in the evaluation unit 14. Thereby each single flat electrode 11, 12 can detect on the one hand an approaching of the user 4 and on the other hand the movement of the user 4 in the scope of a complex movement pattern 9 along the shaped flat electrode 11, 12 according to the invention. This is among others realized by the fact that flat electrode 11, 12 comprises areas along its extension with different capacitive sensitivity like previously described. Likewise, it is possible that the electrode 16 according to FIG. 5 is shaped as the recently described flat electrode.

REFERENCE LIST

- 1 motor vehicle
- 2 motor vehicle door
- 3 lock
- 4 user
- 5 user-held identifier
- 6 trigger signal
- 7 vehicle-related action
- 8 authentication purpose
- 9 movement pattern
- 10 safety system
- 11 first sensor
- 11*a* electrode section with a greater surface width
- 11*b* electrode section with a smaller surface width
- 12 seconds sensor
- 12*a* electrode section with a greater surface width
- 12*b* electrode section with a smaller surface width
- 13 first monitoring zone
- 14 second monitoring zone
- 15 electronic unit
- 16 third sensor
- 17 evaluation unit
- 18 transceiver unit
- 19 movement pattern recognition
- 30 window
- 31 fuel lid
- 32 sliding roof
- 33 trunk lid
- 34 motor vehicle rear end
- 35 recessed grip
- 36 platform
- 37 handle, door handle
- 38 control

What is claimed is:

1. Safety system (10) for a motor vehicle door (2) of a motor vehicle (1), with an electronic unit (15), which comprises at least one first (11) and one second sensor (12), wherein each sensor (11, 12) comprises an own monitoring zone (13, 14) at the motor vehicle door (2), a lock (3) assembled at the motor vehicle door (2), that can be brought between a locking position and an unlocking position, and a user-held identifier (5), which can be brought in data communication with a vehicle-related transceiver unit (18) for authentication purpose (8), wherein the electronic unit (15) is shaped in a way that via at least a defined movement pattern (9) of the user (4) within each of the monitoring zones (13, 14) a trigger signal (6) can be generated by the electronic unit (15), wherein a change of positions of the lock (3) is possible, wherein based on a positive authentication, both sensors (11, 12) are switched on in order to effectively sense the movement pattern (9), wherein the electronic unit (15) comprises an evaluation unit (17) which in dependence of the movement pattern, which sensed by the first (11) and the second sensor (12), generates different trigger signals (6) for vehicle-related actions (7), and wherein at least one sensor (11, 12) can be switched ineffective by the evaluation unit (17).

2. Safety system (10) according to claim 1, characterized in that
a handle (37) is assembled at the vehicle door (2), in which at least partially the electronic unit (15) is integrated, wherein particularly the first sensor (11) is assembled in the motor vehicle door (2) and the second sensor (12) is assembled in the handle (37).

3. Safety system (10) according to claim 1, characterized in that
a defined time interval is intended in the electronic unit (15), in which both sensors (11, 12) are to be activated according to the movement pattern (9) in order to generate a trigger signal (6).

4. Safety system (10) according to claim 1, characterized in that
the electronic unit (15) comprises three sensors (11, 12, 16), wherein the first (11) and the second sensor (12) serve for the recognition of a movement pattern (9) at the motor vehicle door (2) and the third sensor (16) is assembled at the motor vehicle (1) in a way in order to initially recognize the user (4) regardless that the user (4) has performed a movement pattern (9).

5. Safety system (10) according to claim 4, characterized in that
the electronic unit (15) comprises an evaluation unit (17), which in dependence of the movement pattern (9), which is sensed by the first (11) and the second sensor (12) and/or the third sensor (16), generates different trigger signals (6) for vehicle-related actions (7), wherein particularly
a trigger signal (6) releases the locking of the lock (3) and/or
a trigger signal (6) releases the unlocking of the lock (3) and/or
a trigger signal (6) supports the opening of the motor vehicle door (2) and/or
a trigger signal (6) supports the closing of the vehicle door (2) and/or
a trigger signal (6) releases the opening of the motor vehicle window (30) and/or
a trigger signal (6) releases the closing of the motor vehicle window (30) and/or
a trigger signal (6) releases the opening of the fuel lid (31) of the motor vehicle (1) and/or
a trigger signal (6) releases the closing of the fuel lid (31) of the motor vehicle (1) and/or
a trigger signal (6) releases the closing of the sliding roof (32) of the motor vehicle (1) and/or
a trigger signal (6) releases the opening of the sliding roof (32) of the motor vehicle (1) and/or
a trigger signal (6) releases the closing of the trunk (33) of the motor vehicle (1) and/or
a trigger signal (6) releases the opening of the trunks of (33) of the motor vehicle (1).

6. Safety system (10) according to claim 5, characterized in that
at least one sensor (11, 12, 16) is switched ineffective via the evaluation unit (17), particularly with or without time delay.

7. Safety system (10) according to claim 4, characterized in that
the third sensor (16) can be activated to via the user (4) outside the motor vehicle (1), particularly that via a further movement pattern (9) the third sensor (16) can be activated.

8. Safety system (10) according to claim 4, characterized in that the third sensor (16) is assembled underneath the motor vehicle door (2), particularly at a door sill of the door (2), or that the third sensor (16) is assembled at or underneath a bumper at the rear end of the motor vehicle (34).

9. Safety system (10) according to claim 2, characterized in that the motor vehicle door (2) comprises a recessed grip (35), at which particularly the handle (37) is assembled, wherein the first sensor (11) and/or the second sensor (12) is assembled at the recessed grip (35).

10. Safety system (10) according to claim 4, characterized in that the third sensor (16) can be activated by a movement of the foot of the user (4).

11. Safety system (10) according to claim 1, characterized in that the motor vehicle door (2) is without a handle, particularly without a grip, so at the first (11) and second sensor (12) are positioned in the motor vehicle door (2).

12. Safety system (10) according to claim 1, characterized in that the first sensor (11) is assembled adjacent to the second sensor (12) and/or that the first sensor (11) is assembled horizontal to the platform (36) of the motor vehicle (1) adjacent to the second sensor (12) and/or that the first sensor (11) is assembled horizontal to the platform (36) of the motor vehicle (1) above the second sensor (12) and/or that the first sensor (11) is assembled at least partially above the second sensor (12).

13. Safety system (10) according to claim 1, characterized in that the lock (3) is a mechanical lock (3) or an electromechanical lock (3).

14. Safety system (10) according to claim 1, characterized in that the first sensor (11) comprises a distance D to the second sensor (12), which is between 5 cm≤D≤30 cm, particularly between 10 cm≤D≤20 cm.

15. Safety system (10) according to claim 1, characterized in that the first sensor (11) and/or the second sensor (12) are shaped as a longitudinal flat electrode, wherein in longitudinal direction sensitive electrode sections (11a, 12a) with a first surface width with minor sensitive electrode sections (11b, 12b) alternate with a second, smaller surface width.

16. Safety system (10) according to claim 1, wherein the electronic unit (15) is shaped in a way, that new and/or additional new movement patterns (9) can be generated by the user (4) and are detectable by both sensors (11, 12) in order to generate trigger signals (6) for further vehicle related actions (7).

* * * * *